(12) United States Patent
Yamamoto

(10) Patent No.: US 7,755,084 B2
(45) Date of Patent: Jul. 13, 2010

(54) SEMICONDUCTOR WAFER, SEMICONDUCTOR CHIP AND METHOD OF MANUFACTURING SEMICONDUCTOR CHIP

(75) Inventor: Hiroshi Yamamoto, Chiba (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 335 days.

(21) Appl. No.: 11/856,935

(22) Filed: Sep. 18, 2007

(65) Prior Publication Data

US 2008/0258144 A1    Oct. 23, 2008

(30) Foreign Application Priority Data

Sep. 27, 2006    (JP)    ............... 2006-262529

(51) Int. Cl.
    *H01L 23/58*    (2006.01)
(52) U.S. Cl. .......... 257/48; 257/E21.522; 257/E21.523; 257/E21.524; 438/18
(58) Field of Classification Search ............ 257/48, 257/E21.522, E21.523, E21.524; 438/14
    See application file for complete search history.

(56) References Cited

U.S. PATENT DOCUMENTS 5,654,582 A    8/1997    Kijima et al.

7,078,805 B2    7/2006    Makabe et al.
2003/0082836 A1*    5/2003    Fetterman et al. ............. 438/14

FOREIGN PATENT DOCUMENTS

| JP | 07302773 | 11/1995 |
|---|---|---|
| JP | 2003234312 | 8/2003 |
| JP | 2004140157 | 5/2004 |
| JP | 2005032983 | 2/2005 |

\* cited by examiner

*Primary Examiner*—Tu-Tu V Ho
(74) *Attorney, Agent, or Firm*—Volentine & Whitt, P.L.L.C.

(57) ABSTRACT

A semiconductor wafer is provided with a substrate having a semiconductor element formation layer, a lowermost metal layer formed on the semiconductor element formation layer and an uppermost layer formed on the lowermost metal layer, and the semiconductor wafer also has plural chip regions and an evaluation element region that is that is defined as a region between the plurality of chip regions and that has a cutaway region that is subjected to dicing when separating an individual chip and a remnant region that is not subjected to dicing when separating the chip, and a lowermost layer electrode pad and an uppermost layer electrode pad that are formed at the remnant region and at a pad region are configured by a combination of metals having a line width of less than or equal to a predetermined value.

9 Claims, 3 Drawing Sheets

SEMICONDUCTOR WAFER, SEMICONDUCTOR CHIP AND METHOD OF MANUFACTURING SEMICONDUCTOR CHIP

CROSS-REFERENCE TO RELATED APPLICATION

This application claims priority under 35 USC 119 from Japanese Patent Application No. 2006-262529, the disclosure of which is incorporated by reference herein.

BACKGROUND OF THE INVENTION

1. Field of the Invention

The present invention relates to a semiconductor wafer that has a chip region and an evaluation element region and to a semiconductor chip individually separated from the semiconductor wafer. Further, the present invention relates to a method of manufacturing a semiconductor chip from a semiconductor wafer that has a chip region and an evaluation element region.

2. Description of Related Art

Conventionally, in the manufacture of semiconductor chips, evaluation elements known as a Test Element Group (TEG) are disposed between chip regions of a semiconductor wafer (on scribe lines), and the characteristics of the evaluation elements are observed prior to performing separation of individual semiconductor chips. It is known that by observing the characteristics of the TEG, which was formed by an identical process to the process for forming semiconductor chips, a similar effect can be obtained to observing the characteristics of semiconductor chip elements themselves.

In recent years, the prevailing direction of technological development has aimed at reducing the width of the scribe line in order that a larger number of semiconductor chips can be obtained from a single semiconductor wafer. As with the invention disclosed in Japanese Patent Application (JP-A) No. 07-302773, this involves severing, by dicing, an electrode pad used for evaluation element measurement. As disclosed in JP-A No. 2003-234312, when a soft material such as aluminum is used as the material of the electrode pad for evaluation element measurement, burrs (metal peeling) are generated by dicing. When semiconductor devices or semiconductor chips are packaged by Tape Automated Bonding (TAB) techniques such as Tape Carrier Package (TCP) or Chip Size Package (CSP) techniques, or Chip on Glass (COG) techniques that directly mount semiconductor chips onto a glass substrate, there is a risk that adjacent inner leads or wiring will short-circuit due to the burrs (metal peeling). Further to JP-A No. 2003-234312, the invention of JP-A No. 2004-140157 is another example of an invention that addresses this kind of problem.

However, in recent years, despite the fact that TEG electrode pads have also come to be arranged in multiple layers, respective wiring layers have become extremely thin. In the midst of these trends in technological development, the inventors of the present application noticed that the occurrence of burrs (metal peeling) could not be effectively reduced even by using techniques such as those disclosed in the above patent documents. Further, even if a certain degree of reduction is achieved, inner leads and wiring adjacent to burrs (metal peeling) that do occur are not prevented from short-circuiting. The present invention was completed in view of the foregoing circumstances and provides a semiconductor wafer that enables effective reduction in the occurrence of burrs (metal peeling) and in the event, for example, that burrs (metal peeling) do occur, enables reduction in the probability of short-circuiting of adjacent inner leads and wiring and, consequently, that enables production of a large number of high quality semiconductor chips from a single semiconductor wafer.

SUMMARY OF THE INVENTION

The semiconductor wafer of the present invention includes a substrate, a semiconductor element formation layer formed on the substrate, a lowermost metal layer formed on the semiconductor element formation layer, and an uppermost metal layer formed on the lowermost metal layer, and further includes multiple chip regions, an evaluation element region that is defined as a region between the plurality of chip regions and that has a cutaway region that is subjected to dicing when separating an individual chip and a remnant region that is not subjected to dicing when separating the chip, an evaluation element formed at the evaluation element region, a lowermost layer electrode pad that is formed at a pad region defined as extending from the remnant region over the cutaway region within the evaluation element region, and that is formed at the lowermost metal layer so as to be electrically connected to the evaluation element, and an uppermost layer electrode pad that is formed at the pad region and that is electrically connected to the lowermost layer electrode pad, and the lowermost layer electrode pad and the uppermost layer electrode pad that are formed at the remnant region and the pad region are configured by a combination of metals having a line width of less than or equal to a predetermined value.

The configuration of the semiconductor wafer of the present invention reduces the probability of short-circuiting of inner leads or wiring adjacent to burrs (metal peeling) that have been generated in a semiconductor chip that has been separated and, consequently, enables production of a large number of high quality semiconductor chips from a single semiconductor wafer.

BRIEF DESCRIPTION OF THE DRAWINGS

Preferred exemplary embodiments of the present invention will be described in detail based on the following figures, wherein.

DETAILED DESCRIPTION OF THE INVENTION

Figure 1:
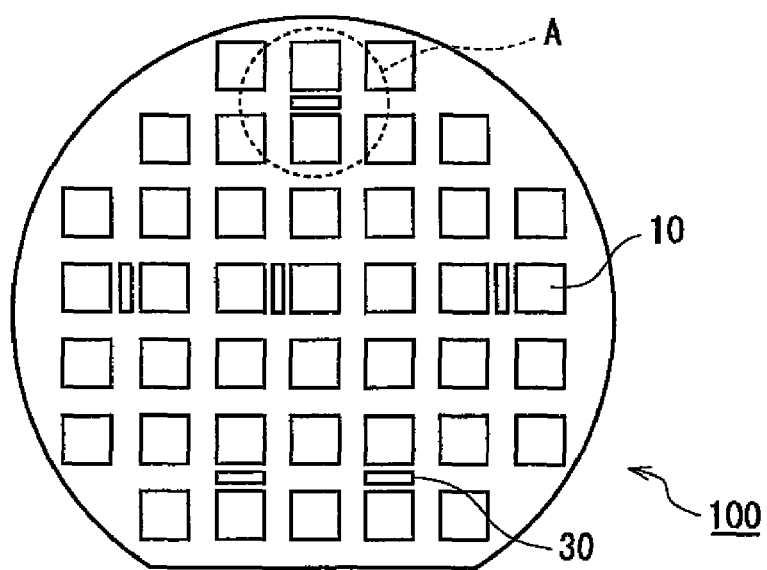
FIG. 1 is a top view of a semiconductor wafer according to a first embodiment of the present invention.

In the following, embodiments of the present invention will be explained in detail based on the drawings. Further, in the following explanation and in the attached drawings, structural elements having substantially identical functions and configurations are provided with the same reference numerals and explanation thereof is not repeated.

First Embodiment

Figure 2:
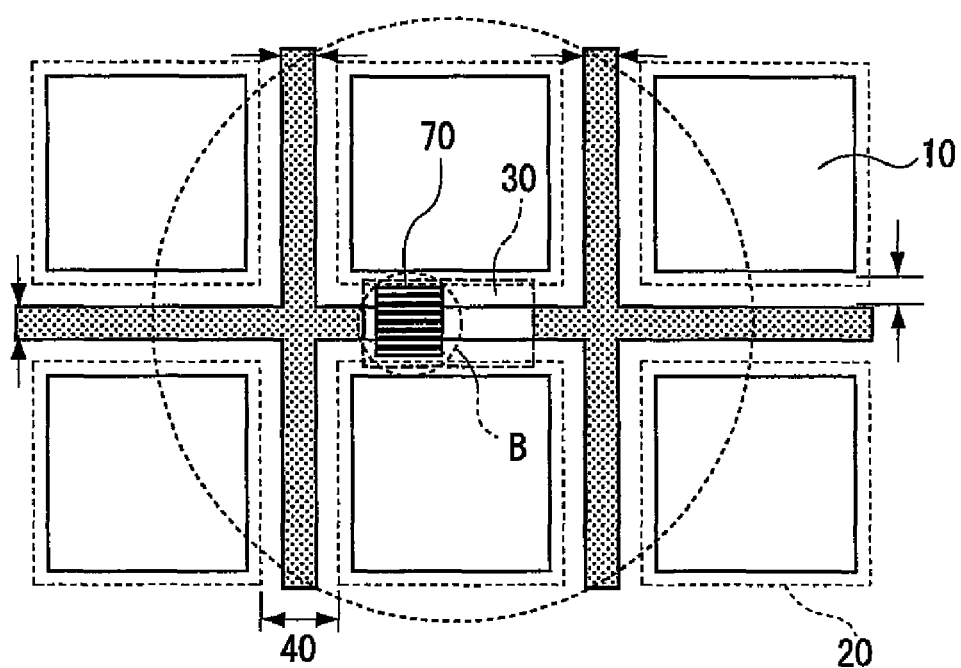
FIG. 2 is an enlarged view of portion A of FIG. 1.

First, a semiconductor wafer according to a first embodiment of the present invention is explained using FIGS. 1, 2, and 3A-3D. FIG. 1 is a top view of semiconductor wafer 100 according to a first embodiment of the present invention. As illustrated in the drawing, semiconductor wafer 100 is formed of semiconductor chips 10 and evaluation elements 30. FIG. 2 is an enlarged view of portion A of FIG. 1. As shown in FIG. 2, semiconductor chips 10 are regions on a substrate that has a semiconductor element layer, and represent a plurality of chip regions 20 on a substrate at which functional circuits are formed, which become semiconductor chips 10 after a subsequent separation process. Further, evaluation elements 30 are elements formed on the substrate in regions other than chip regions 20 described above. In the following, the regions in which evaluation elements 30 are formed are referred to as evaluation element formation regions 40. In addition, evaluation element formation regions 40 consist of cutaway regions 50 that are subjected to dicing in the separation process described above, and remnant regions 60 that are not subjected to dicing in the separation process.

At evaluation element formation regions 40, in addition to the formation of evaluation elements 30, measurement pads 70 are formed on the surface of semiconductor wafer 100 so as to be electrically connected to evaluation elements 30.

Figure 3A:
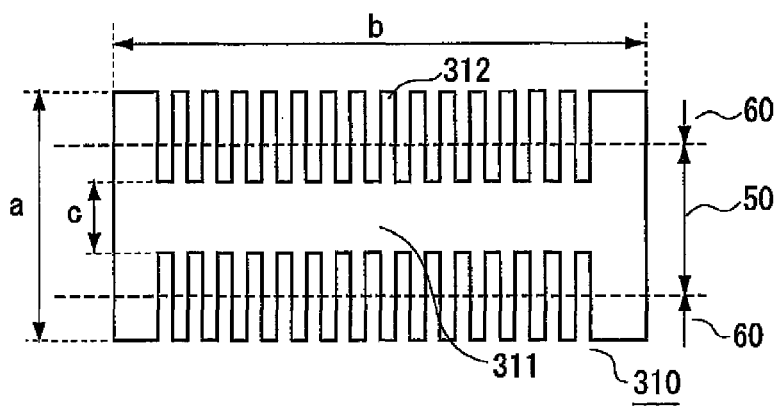
FIG. 3A is an enlarged view of a measurement pad in portion B of FIG. 2.

The configuration of measurement pads 70 and the configuration of wiring positioned at a bottom layer of measurement pads 70 are shown in FIGS. 3A-3D. Further, FIG. 4 relates to a measurement pad and wiring positioned at the bottom layer of a measurement pad having a multilayer structure. In the following, measurement pads 70 and the wiring positioned at the bottom layer of the measurement pads are collectively designated metal 310. The configuration of metal 310 as shown in FIG. 3A has a short side of width a and a long side of length b. For width a and length b, for example, a=60 μm and b=90 μm. Further, metal 310 has width c at a central portion in the direction of the short side, and has central portion 311 that extends in the direction of the long side and multiple extending parts 312, each having width d, that extend from central portion 311 in the direction of the short side. The central portion at which central portion 311 is formed is within cutaway region 50. Further, extending parts 312 are formed integrally with central portion 311 and are formed to extend from cutaway region 50 into remnant region 60. For widths c and d, for example, c=10 μm and d=1-5 μm. The multiple extending parts 312 are respectively formed with intervals e provided therebetween. For interval e, for example, e=1-3 μm.

Figure 3B:
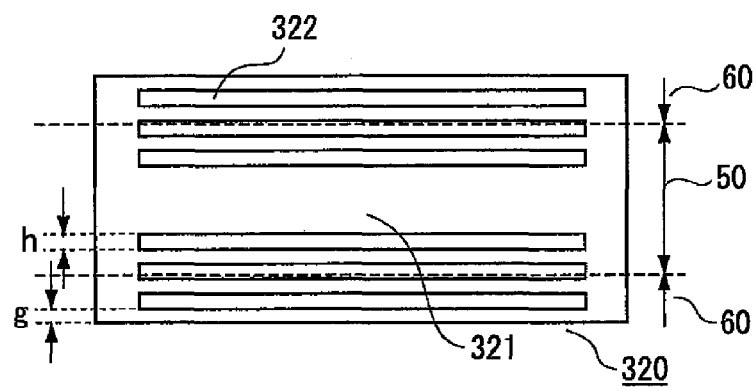
FIG. 3B is an enlarged view of a measurement pad in portion B of FIG. 2.

The configuration of metal 320 as shown in FIG. 3B has a short side of width a and a long side of length b, similarly to FIG. 3A. Metal 320 has central portion 321 of width c and multiple slits 322 extending in the direction of the long side aligned with central portion 321. Slits 322 each have width f. Slits 322 are respectively formed with intervals g provided therebetween. For width f and interval g, for example, f=1-5 and g=1-5 μm.

Figure 3C:
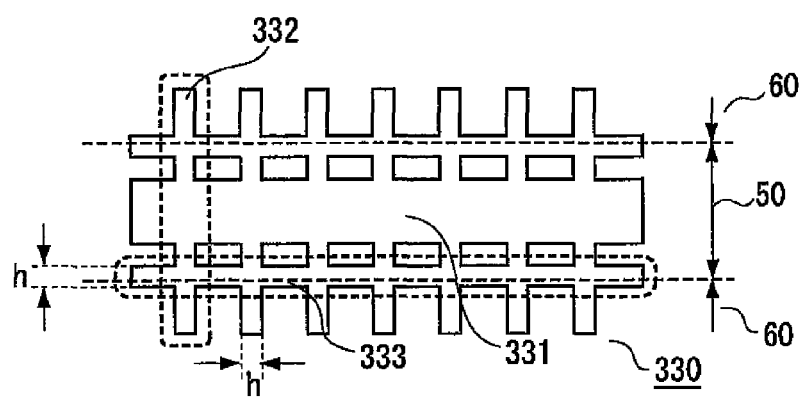
FIG. 3C is an enlarged view of a measurement pad in portion B of FIG. 2.

The configuration of metal 330 as shown in FIG. 3C has a short side of width a and a long side of length b, similarly to FIG. 3A. Metal 330 has central portion 331 of width c, multiple extending parts 332 that extend in the direction of the short side and multiple extending parts 333 that extend in the direction of the long side. Central portion 331 and extending parts 332, 333 of metal 330 are formed integrally. In other words, metal 330 is formed in a reticulated arrangement whereby central portion 331 and extending parts 332, 333 are interlinked in a network. Extending parts 332, 333 each have width h where, for example, h=1-5 μm.

Figure 3D:
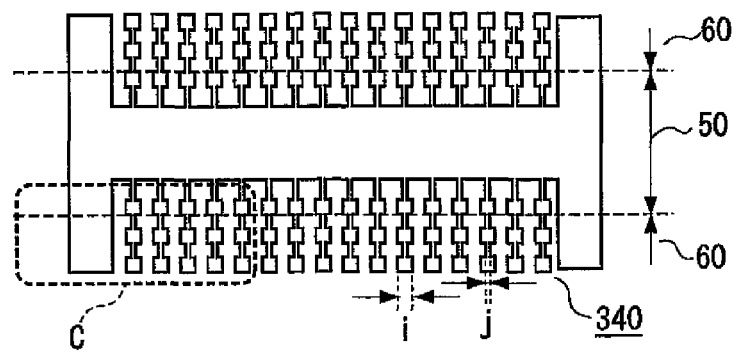
FIG. 3D is an enlarged view of a measurement pad in portion B of FIG. 2.

The configuration of metal 340 as shown in FIG. 3D is a variation of that shown in FIG. 3A. The configuration of extending parts 312 of FIG. 3A is modified. Extending parts 342 shown in FIG. 3D have differing widths i and j. In other words, each extending part 342 has multiple wide and thin portions. For i and j, for example, i=2-5 μm, j=1-2.5 μm and i>j. To sum up the metals shown in FIGS. 3A-3D, the metals formed at the remnant regions are formed in combinations of metals having a width of 5 μm or less.

Figure 4:
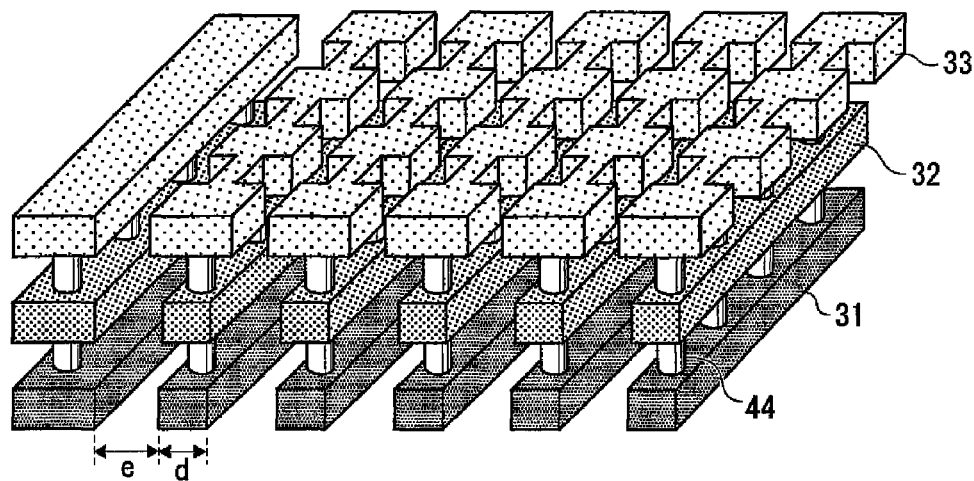
FIG. 4 is a perspective view of portion C of a measurement pad of FIG. 3D.

FIG. 4 is an enlarged perspective view of portion C shown in FIG. 3D. Portion C is disposed at evaluation element formation region 40 of semiconductor wafer 100. Uppermost layer metal 33 corresponds to measurement pad 70 shown in FIG. 3D. While not shown, lowermost layer metal 31 is formed on evaluation element 30, which is formed at evaluation element formation region 40, via an insulating film. Lowermost layer metal 31 is electrically connected to evaluation element 30. Intermediate metal 32 is formed on lowermost layer metal 31 via an insulating film that is not shown. Intermediate metal 32 is electrically connected to lowermost layer metal 31 via contacts 44 or the like. Uppermost layer metal 33 is formed on intermediate metal 32 via an insulating film that is not shown. Uppermost layer metal 33 is electrically connected to intermediate metal 32 via contacts 45 or the like. Accordingly, lowermost layer metal 31, intermediate metal 32, and uppermost layer metal 33 are respectively electrically connected.

Further, any of the metals shown in FIGS. 3A-3D may be used as lowermost layer metal 31, intermediate metal 32, and uppermost layer metal 33, however as described in the explanation of FIGS. 3A-3D, it is important that the metal formed on the remnant region is formed at a width of 5 μm or less. The fact that the structures shown in FIGS. 3A-3D are used in the metal layers in all of lowermost layer metal 31, intermediate metal 32, and uppermost layer metal 33 is the principal feature of the present invention. In addition, the present invention is particularly effective when measurement pads 70 are left as residue when dicing is performed in the separation process when the distance between adjacent chip regions 20, that is, the width of evaluation element formation regions 40, is 100 μm or less; in other words, when a dicing blade that is thinner than the length of the short side of measurement pads 70 is used. Accordingly, adopting the structure of the first embodiment of the present invention enables the occurrence of burrs (metal peeling) to be effectively reduced when the width of the evaluation element formation regions 40 is reduced and measurement pads 70 are left as residue after dicing.

Second Embodiment

Figure 5:
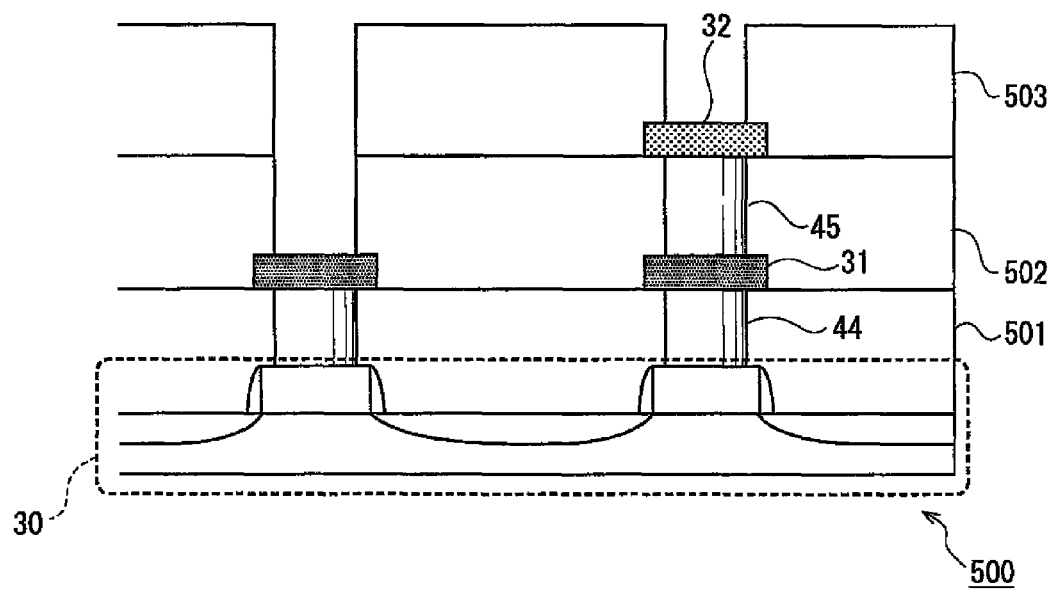
FIG. 5 is a sectional view of a second embodiment of the present invention.

A semiconductor wafer according to a second embodiment of the present invention is explained using FIG. 5. FIG. 5 is a sectional view of an evaluation element formation region 40 of the first embodiment. The second embodiment is configured with variations applied to evaluation element formation regions 40 of the first embodiment. Accordingly, explanation is limited to evaluation element formation regions 40. As shown in FIG. 5, semiconductor wafer 500 according to the second embodiment has evaluation element 30 formed on an evaluation element formation region. Lowermost layer metal 31 is formed on evaluation element 30 via interlayer insulating film 501. Intermediate metal 32 is formed on lowermost layer metal 31 via interlayer insulating film 502. Interlayer insulating film 503 is formed on interlayer insulating film 502 and intermediate metal 32. Further, while not shown, a protective film or the like is formed as needed on interlayer insulating film 503.

The surface of evaluation element formation region 40 of semiconductor wafer 500 corresponds to the upper surface of interlayer insulating film 503 or, in some cases, to the upper layer of the protective film. The upper surface of intermediate metal 32 is located at a lower position than the surface of evaluation element formation region 40 of semiconductor wafer 500. In the second embodiment, there is no metal that corresponds to uppermost layer metal 33 in the first embodiment. In addition, uppermost layer metal 33 formed in the first embodiment is positioned upward of interlayer insulating film 503. The principal feature of the second embodiment is the fact that intermediate metal 32 is exposed through interlayer insulating film 503. Exposure of intermediate metal 32 is achieved by etching of interlayer insulating film 503. Accordingly, intermediate metal 32 corresponds to measurement pad 70 of the first embodiment. Since intermediate metal 32, which corresponds to measurement pad 70, is located at a lower position with respect to the surface of semiconductor wafer 500, it is possible to reduce the likelihood, compared to the first embodiment, of inner leads or wiring short-circuiting even when burrs (metal peeling) are generated. Further, by combination with the structure of the first embodiment, it is possible to manufacture semiconductor chips having a reduced incidence of burrs (metal peeling) and that are of good quality even in the uncommon event of burrs (metal peeling) occurring.

In addition, a configuration in which lowermost layer metal 31 is exposed is conceivable as an alternative example of the second embodiment. Lowermost layer metal 31 is formed on evaluation element 30 via interlayer insulating film 501, and interlayer insulating films 502, 503 are formed on interlayer insulating film 501 and lowermost layer metal 31. Lowermost layer metal 31 is exposed through interlayer insulating films 502, 503. Lowermost layer metal 31 thus corresponds to measurement pad 70. The upper surface of lowermost layer 31 is located at a lower position than the surface of evaluation element formation region 40 of semiconductor wafer 500. Since the distance from the upper surface of lowermost layer 31 to the surface of semiconductor wafer 500 is lengthened, it becomes possible to further reduce the likelihood of inner leads or wiring short-circuiting.

What is claimed is:

1. A semiconductor wafer comprising a substrate having a semiconductor element formation layer, a lowermost metal layer formed on or above the semiconductor element formation layer, and an uppermost metal layer formed on or above the lowermost metal layer, the semiconductor wafer further comprising:
    a plurality of chip regions;
    an evaluation element region that is defined as a region between the plurality of chip regions and that has a cutaway region that is subjected to dicing when separating an individual chip and a remnant region that is not subjected to dicing when separating the chip;
    an evaluation element formed at the evaluation element region;
    a lowermost layer electrode pad that is formed at a pad region defined as extending from the remnant region over the cutaway region within the evaluation element region, and that is formed at the lowermost metal layer so as to be electrically connected to the evaluation element; and
    an uppermost layer electrode pad that is formed at the pad region and that is electrically connected to the lowermost layer electrode pad, wherein
    the lowermost layer electrode pad and the uppermost layer electrode pad that are formed at the remnant region and the pad region are configured by a combination of metals having a line width of less than or equal to a predetermined value.

2. The semiconductor wafer of claim 1, wherein the predetermined value of the line width is 5 μm.

3. The semiconductor wafer of claim 1, wherein configuration of the combination of metals having a line width of less than or equal to a predetermined value is configured by integral formation of a plurality of individual metals combined in one plane, the metals respectively having a line width of less than or equal to the predetermined value.

4. The semiconductor wafer of claim 1, wherein the pad region is a rectangular region having a long side direction in the direction of dicing and a separate short side direction,
    and has a central portion on or above the cutaway region that extends in the long side direction and has a width in the short side direction of greater than 5 μm.

5. The semiconductor wafer of claim 1, wherein the distance between neighboring chip regions of the plurality of chip regions is no more than 100 μm.

6. A method of manufacturing a semiconductor chip, comprising:
    preparing the semiconductor wafer of claim 1,
    wherein the pad region is a rectangular region having a long side direction in the direction of dicing and a separate short side direction,
    and has a central portion on or above the cutaway region that extends in the long side direction and has a width in the short side direction of greater than 5 μm; and
    separating an individual semiconductor chip by performing dicing of the cutaway region using a dicing blade that is thinner than the length of the short side of the pad region.

7. A semiconductor wafer comprising a substrate having a semiconductor element formation layer, and a first metal layer formed on or above the semiconductor element formation layer via a first interlayer insulating film, the semiconductor wafer further comprising:
    a plurality of chip regions;
    an evaluation element region that is defined as a region between the plurality of chip regions and that has a cutaway region that is subjected to dicing when separating an individual chip and a remnant region that is not subjected to dicing when separating the chip;
    an evaluation element formed at the evaluation element region;
    a first electrode pad that is formed at a pad region defined as extending from the remnant region over the cutaway region within the evaluation element region, and that is formed on or above the first interlayer insulating film so as to be electrically connected to the evaluation element; and
    a second interlayer insulating film that is formed on or above the first interlayer insulating film and the first electrode pad so as to expose the first electrode pad through an opening, wherein
    a surface of the first electrode pad is formed at a lower position than a surface of the second interlayer insulating film.

8. The semiconductor wafer of claim 7, wherein the first electrode pad is formed at the remnant region and the pad region and is configured by a combination of metals having a line width of less than or equal to a predetermined value.

9. A semiconductor chip that is individually separated from a semiconductor wafer, the semiconductor wafer comprising:
   a substrate having a semiconductor element formation layer, a lowermost metal layer formed on or above the semiconductor element formation layer, and an uppermost metal layer formed on or above the lowermost metal layer;
   a plurality of chip regions on or above the substrate;
   an evaluation element region that is defined as a region between the plurality of chip regions and that has a cutaway region that is subjected to dicing when separating an individual chip and a remnant region that is not subjected to dicing when separating the chip;
   a test element group (TEG) at the evaluation element region;
   a lowermost layer electrode pad at a pad region defined as extending from the remnant region over the cutaway region within the evaluation element region, and that is at the lowermost metal layer so as to be electrically connected to the evaluation element; and
   an uppermost layer electrode pad that is at the pad region and that is electrically connected to the lowermost layer electrode pad, wherein
   the lowermost layer electrode pad and the uppermost layer electrode pad that are at the remnant region and the pad region are configured by a combination of metals having a line width of less than or equal to a predetermined value, and
   wherein the test element group is configured by a combination of metals having a line width of less than or equal to the predetermined value at the remnant regions peripheral to the chip regions.

* * * * *